United States Patent
Meehleder (10) Patent No.: US 9,964,567 B2
(45) Date of Patent: May 8, 2018

(54) SELF-CONTAINED BRANCH CIRCUIT MONITOR

(71) Applicant: SCHNEIDER ELECTRIC USA, INC., Schaumburg, IL (US)

(72) Inventor: Steve M. Meehleder, Cedar Rapids, IA (US)

(73) Assignee: Schneider Electric USA, Inc., Andover, MA (US)

( * ) Notice: Subject to any disclaimer, the term of this patent is extended or adjusted under 35 U.S.C. 154(b) by 60 days.

(21) Appl. No.: 15/028,047

(22) PCT Filed: Oct. 9, 2013

(86) PCT No.: PCT/US2013/064025
§ 371 (c)(1),
(2) Date: Apr. 8, 2016

(87) PCT Pub. No.: WO2015/053761
PCT Pub. Date: Apr. 16, 2015

(65) Prior Publication Data
US 2016/0258984 A1  Sep. 8, 2016

(51) Int. Cl.
*G01R 15/18* (2006.01)
*G01R 19/25* (2006.01)
*G01R 21/133* (2006.01)

(52) U.S. Cl.
CPC ....... *G01R 15/183* (2013.01); *G01R 19/2513* (2013.01); *G01R 21/133* (2013.01)

(58) Field of Classification Search
None
See application file for complete search history.

(56) References Cited

U.S. PATENT DOCUMENTS 3,701,003 A    10/1972  Anderson
4,262,209 A    4/1981   Berner
(Continued)

FOREIGN PATENT DOCUMENTS

DE    19514342    2/1996
DE    19740428    3/1999
(Continued)

OTHER PUBLICATIONS

International Search Report and Written Opinion dated Mar. 18, 2014 in PCT/US2013/064025, 14 pp.
(Continued)

*Primary Examiner* — Patrick Assouad
*Assistant Examiner* — Demetrius Pretlow
(74) *Attorney, Agent, or Firm* — Locke Lord LLP (57) ABSTRACT

A self-contained branch circuit monitor 2 is has a small form factor configured to fit in the limited space available in a load center 1, in association with a branch circuit breaker 10A occupying a branch location slot 45 in the load center 1. A flexible printed circuit board 4 is wrapped around an outside circumference of a toroidal sensor coil 6 of a current transformer. A current monitoring circuit 15 is formed on the flexible printed circuit board. The monitoring circuit is electrically connected to leads 7, 9 from the sensor coil and is powered by current 17 induced in the sensor coil from current 5 in the branch circuit wire. A branch circuit wire 3A is threaded through the current transformer's center. A transmitter 22 is part of the flexible printed circuit board, to transfer the monitored current data to other locations.

19 Claims, 4 Drawing Sheets

(56) References Cited

U.S. PATENT DOCUMENTS

| | | | |
|---|---|---|---|
| 4,660,889 A | | 4/1987 | Anthony et al. |
| 5,015,944 A | | 5/1991 | Bubash |
| 5,451,939 A | | 9/1995 | Price |
| 5,502,374 A | | 3/1996 | Cota |
| 5,537,087 A | | 7/1996 | Naito |
| 5,877,691 A | * | 3/1999 | Suptitz ............... H01H 71/0228 335/17 |
| 5,892,430 A | * | 4/1999 | Wiesman ................. G01R 1/30 324/126 |
| 6,018,239 A | | 1/2000 | Berkcan et al. |
| 6,034,858 A | | 3/2000 | Serpinet et al. |
| 6,137,665 A | | 10/2000 | Boudaud |
| 6,188,146 B1 | | 2/2001 | Michaels |
| 6,798,209 B2 | | 9/2004 | Lavoie et al. |
| 6,842,325 B2 | * | 1/2005 | Meehleder ............... H01H 9/52 361/160 |
| 6,847,297 B2 | | 1/2005 | Lavoie et al. |
| 6,868,349 B2 | | 3/2005 | Fletcher et al. |
| 7,102,478 B2 | | 9/2006 | Pridmore, Jr. et al. |
| 7,158,012 B2 | | 1/2007 | Wiesman et al. |
| 7,403,015 B2 | | 7/2008 | Carlino et al. |
| 7,412,338 B2 | | 8/2008 | Wynans et al. |
| 7,417,554 B2 | | 8/2008 | Benke et al. |
| 7,436,641 B2 | * | 10/2008 | Holley ................... H01H 9/168 361/64 |
| 7,579,963 B2 | | 8/2009 | Viaro et al. |
| 8,018,097 B2 | | 9/2011 | Saito et al. |
| 8,243,411 B2 | | 8/2012 | Larson |
| 8,358,188 B2 | | 1/2013 | Bellotto et al. |
| 8,368,500 B2 | | 2/2013 | Gilmartin et al. |
| 8,378,663 B2 | | 2/2013 | Cadoux et al. |
| 8,487,724 B2 | | 7/2013 | Fleege |
| 8,760,825 B2 | | 6/2014 | Erger et al. |
| 2001/0052843 A1 | * | 12/2001 | Wiesman ................. H04B 3/56 340/538.16 |
| 2002/0191361 A1 | | 12/2002 | Houbre |
| 2003/0053279 A1 | * | 3/2003 | Meehleder ............... H01H 9/52 361/160 |
| 2004/0178875 A1 | * | 9/2004 | Saito .................... G01R 15/181 336/200 |
| 2004/0257061 A1 | | 12/2004 | George de Buda |
| 2005/0275493 A1 | | 12/2005 | Yamazaki et al. |
| 2006/0176630 A1 | | 8/2006 | Carlino et al. |
| 2006/0271314 A1 | | 11/2006 | Hayes |
| 2007/0109088 A1 | | 5/2007 | Askildsen et al. |
| 2009/0167468 A1 | | 7/2009 | Dauer et al. |
| 2011/0291488 A1 | | 12/2011 | Paik et al. |
| 2012/0038446 A1 | | 2/2012 | McBee et al. |
| 2012/0086433 A1 | * | 4/2012 | Cheng ................... G01R 15/14 324/117 R |
| 2012/0123762 A1 | | 5/2012 | Studer et al. |
| 2012/0221278 A1 | | 8/2012 | Cook |
| 2012/0280828 A1 | | 11/2012 | Kim |
| 2013/0054162 A1 | | 2/2013 | Smith et al. |
| 2013/0066478 A1 | | 3/2013 | Smith |
| 2013/0107412 A1 | | 5/2013 | Schalk et al. |
| 2013/0108027 A1 | | 5/2013 | Kioski et al. |
| 2013/0200971 A1 | * | 8/2013 | Crutcher ................. H01F 27/24 336/90 |
| 2014/0015516 A1 | * | 1/2014 | Sorensen ............... G01R 19/00 324/127 |
| 2014/0062459 A1 | | 3/2014 | El-Essawy et al. |
| 2015/0002138 A1 | * | 1/2015 | Fox ..................... G01R 15/142 324/149 |

FOREIGN PATENT DOCUMENTS

| | | |
|---|---|---|
| EP | 2618166 | 7/2013 |
| JP | 2003050254 | 3/1999 |
| WO | WO2010119332 | 10/2010 |
| WO | WO2012054337 | 4/2012 |

OTHER PUBLICATIONS

"Electronic Trip Circuit Breaker Basics" Circuit Breaker Application Guide, Data Bulletin 0600DB1104, Mar. 2012, 14pp.

Extended European Search Report for Application No. 138954116-1568 / 3055701 PCT/US2013064025 dated Jun. 12, 2017.

* cited by examiner

SELF-CONTAINED BRANCH CIRCUIT MONITOR

FIELD OF THE INVENTION

The invention is generally directed to load centers.

BACKGROUND OF THE INVENTION

In order to create a Smart Grid infrastructure to better manage energy resources, it will be necessary to monitor and measure energy demand at the individual points of consumption, in homes, at places of business, and at industrial sites. The focal point for electrical power distribution in homes, businesses, and factories is the load center, where the branch circuits are organized with branch circuit breakers occupying branch location slots in the load center, and connected through the circuit breakers to an incoming main power bus. The load center is one location for installing the capability to monitor and measure energy demand.

The universal installation of energy monitoring equipment in homes, businesses, and factories must be simple, practical, and not expensive. In the prior art, branch circuit monitoring systems required the installation of current sensing circuits on each individual branch circuit line and wiring a power source to each sensing circuit. Such a solution is neither simple, practical, nor inexpensive.

SUMMARY OF THE INVENTION

The invention provides simple, practical, and relatively inexpensive equipment to convert a load center in a home, business, or factory, to enable energy monitoring for a Smart Grid infrastructure. The invention requires no external wiring to power its operations and does not require modification of or connection to the branch circuit breakers in the load center. Instead, a self-contained branch circuit monitor is threaded onto the load wire of each branch circuit to be monitored in the load center. The self-contained branch circuit monitor has a small form factor to enable fitting within the limited space available in the load center, such as in a wiring trough or in the branch location slot.

The self-contained branch circuit monitor includes a current transformer, typically being a sensor coil of magnet wire wound as a toroidal coil about a high magnetic permeability toroidal core. Wrapped about the outside circumference of the toroidal coil is a flexible printed circuit board. A monitoring circuit is formed on the flexible printed circuit board and is connected to leads from the sensor coil. The branch circuit wire has been threaded through the center of the toroidal core.

The operation of the monitoring circuit is powered by the current induced in the sensor coil from the monitored load current in the branch circuit wire. The monitoring circuit includes a rectifier that charges a capacitor from the current induced in the sensor coil, during a first stage of operation. A voltage regulator in the monitoring circuit, senses when the capacitor has been sufficiently charged to transition to a second stage of operation. In the second stage of operation, the operating power from the charged capacitor is supplied to a microcontroller, an analog-to-digital (A/D) converter, an encoder, and a transmitter in the monitoring circuit.

During the second stage of operation, which lasts as long as sufficient charge remains in the capacitor, the A/D converter, acting as a current measuring device, samples the current induced in the sensor coil, whose magnitude is related to the magnitude of the monitored load current. The A/D converter outputs a digital value representing the magnitude of monitored load current.

While there remains sufficient charge on the capacitor, the encoder encodes the digital value representing the magnitude of monitored load current and the transmitter transmits the digital value to a receiver that may be located in the load center. The transmitted digital value provides information characterizing the load current sensed in the associated branch circuit. The information may be used to set an alarm, analyze energy consumption, stored for future use, or transmitted to the Smart Grid.

The self-contained branch circuit monitor has no need for a power supply voltage connection with the attendant costs, no need for extra wire in a constricted space, minimal installation costs, minimized potential mistakes during installation, and minimal product costs. Since there are no terminals or exposed wires, the self-contained branch circuit monitor may be made very robust and essentially immune from electrical noise sources. The self-contained branch circuit monitor may be lower cost than competing approaches because the low voltages and currents use very small die size semiconductor devices and very small components.

BRIEF DESCRIPTION OF THE DRAWINGS

Example embodiments of the invention are depicted in the accompanying drawings that are briefly described as follows.

DETAILED DESCRIPTION OF THE EXAMPLE EMBODIMENTS

The invention provides simple, practical, and relatively inexpensive equipment to convert a load center in a home, business, or factory, to enable energy monitoring for a Smart Grid infrastructure. The invention requires no external wiring to power its operations and does not require modification of or connection to the branch circuit breakers in the load center. Instead, a self-contained branch circuit monitor is threaded onto the load wire of each branch circuit to be monitored in the load center. The self-contained branch circuit monitor has a small form factor to enable fitting within the limited space available in the load center, such as in a wiring trough or in the branch location slot. The self-contained branch circuit monitors may be easily retrofitted on the branch circuit wires in the load center.

Figure 1A:
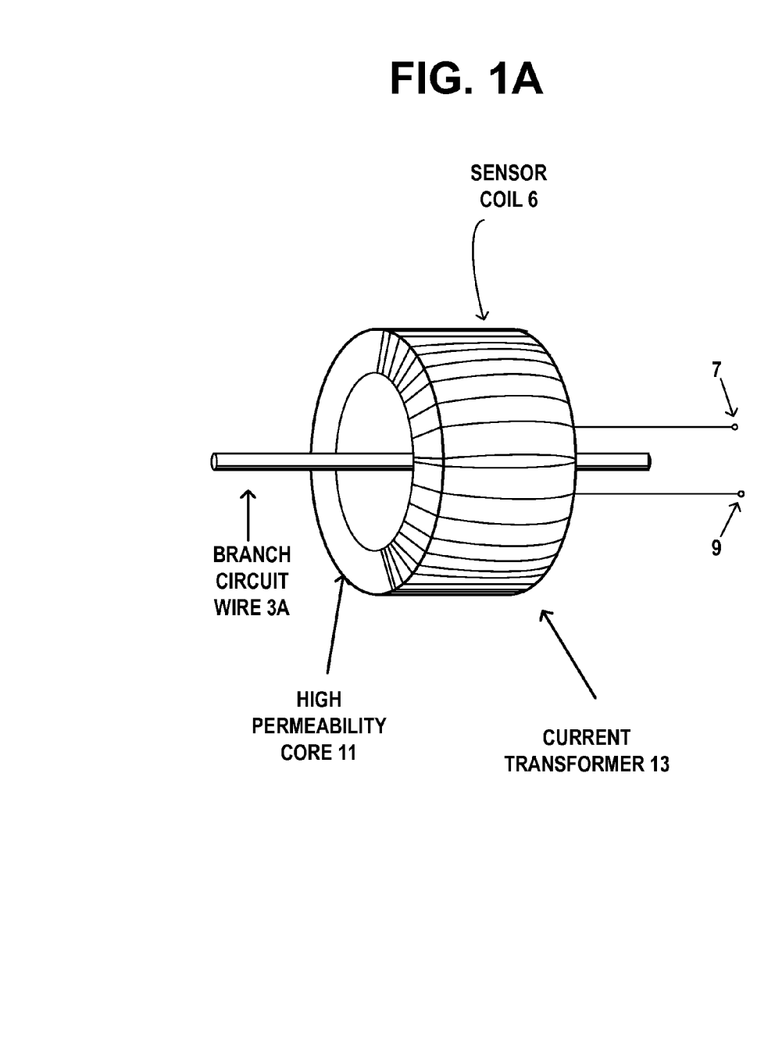
FIG. 1A illustrates a building block of the invention, showing the self-contained branch circuit monitor including a current transformer with a toroidal coil and a high magnetic permeability toroidal core.

FIG. 1A illustrates an example embodiment of the invention, showing the self-contained branch circuit monitor 2 as a current transformer 13 with a toroidal sensor coil 6 and a high magnetic permeability toroidal core 11. The sensor coil 6 may be magnet wire wound as a toroidal coil about a high magnetic permeability toroidal core 11, forming a toroidal current transformer. The toroidal core 11 has a branch circuit wire 3A threaded through the toroidal core's center. The toroidal core 11 may be composed of a ferromagnetic material having a high permeability, such as silicon steel or high permeability ferrite.

Figure 1B:
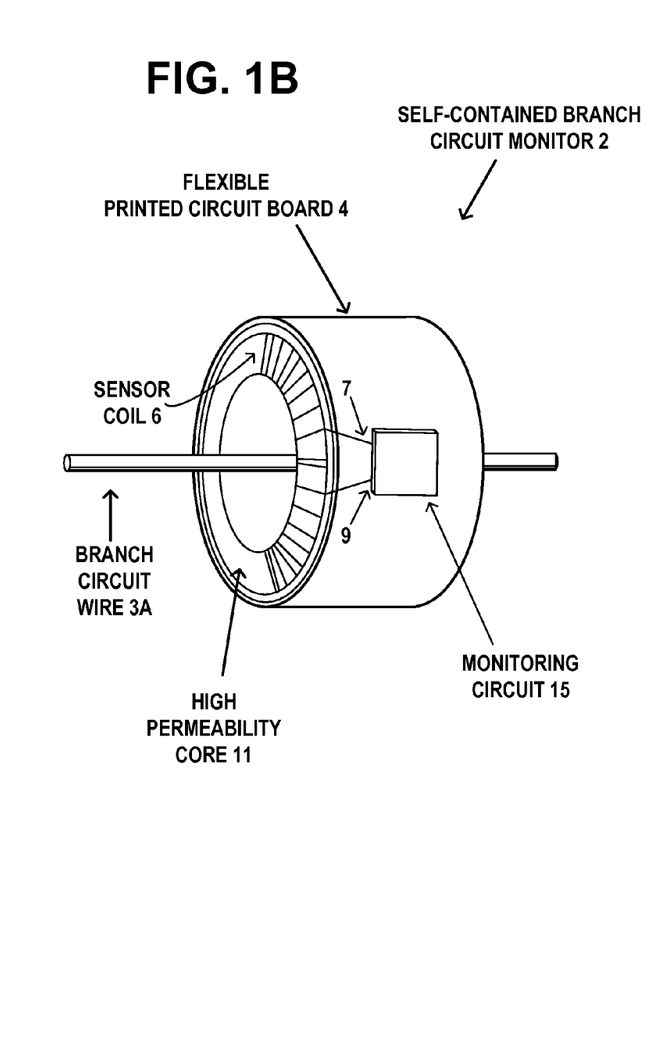
FIG. 1B illustrates the example embodiment of the invention shown in FIG. 1A, showing the self-contained branch circuit monitor with the flexible printed circuit board wrapped about the outside circumference of the toroidal coil. The monitoring circuit is shown on the flexible printed circuit board and is connected to leads from the sensor coil. The branch circuit wire is shown threaded through the center of the toroidal core.

FIG. 1B illustrates the example embodiment of the invention shown in FIG. 1A, showing the self-contained branch circuit monitor 2 with the flexible printed circuit board 4 wrapped about the outside circumference of the toroidal coil 11. The monitoring circuit 15 is shown formed on the flexible printed circuit board 4 and is connected to leads 7 and 9 from the sensor coil 6. The branch circuit wire 3A is shown threaded through the center of the toroidal core 11.

The flexible printed circuit board 4 comprises a flexible substrate having conductive lines deposited thereon. The flexible printed circuit board 4 has at least one component, the monitoring circuit 15, attached to the flexible substrate and electrically interconnected by the conductive lines. The flexible substrate of the flexible printed circuit board 4 has an adhesive coating on a backside thereof to fasten the flexible printed circuit board 4 to the toroidal coil's 11 outside circumference.

An example flexible printed circuit board 4 may be composed of a thin sheet of polyimide that has a thin copper layer on one or both sides. The thin copper layer may be masked with the pattern of conductor lines desired and then etched by photolithographic techniques to remove unmasked areas of the copper, leaving the copper conductor lines beneath the masking. The copper conductor lines may be terminated with contact pads. The monitoring circuit 15 may be embodied as a large scale integrated (LSI) circuit chip with contact electrodes composed of a low melting point solder, on its underside. The contact electrodes of the LSI chip may be aligned with the contact pads of the conductor lines on the polyimide sheet and joined by heating the assembly to the melting temperature of the low melting point solder, for example. The adhesive coating may be applied on the backside flexible printed circuit board 4 to fasten the flexible printed circuit board 4 to the toroidal coil's 11 outside circumference.

Figure 1C:
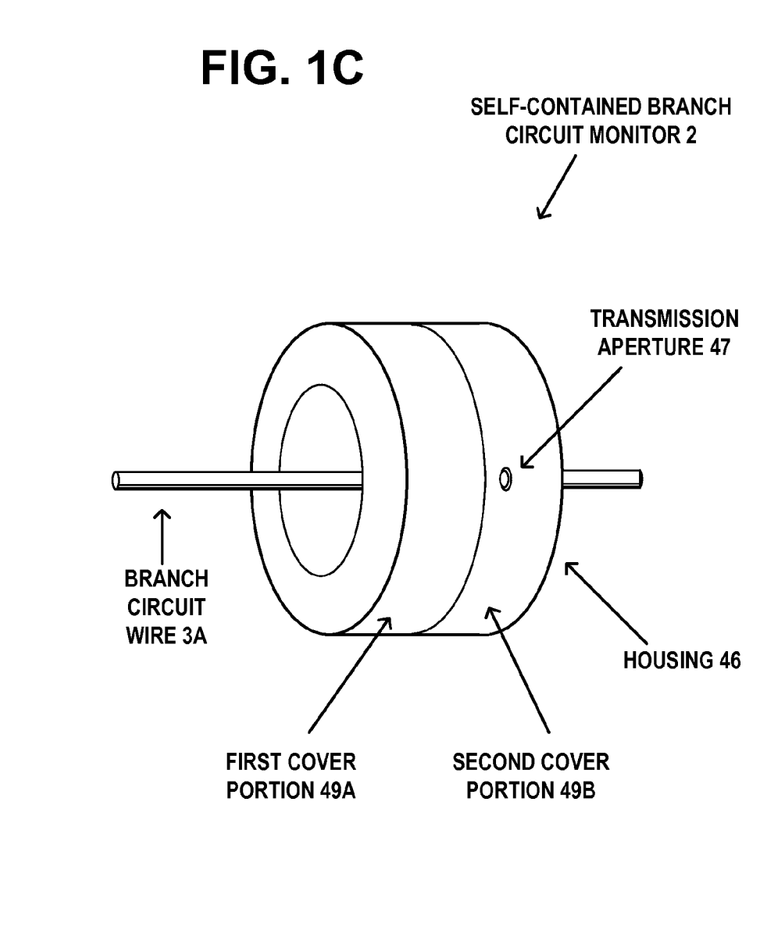
FIG. 1C illustrates the example embodiment of the invention shown in FIG. 1B, showing the self-contained branch circuit monitor enclosed in a two piece housing having a transmission aperture to facilitate transmission of the current measurement information.

FIG. 1C illustrates the example embodiment of the invention shown in FIG. 1B, showing the self-contained branch circuit monitor 2 enclosed in a housing 46. The example housing 46 may be a two-piece housing comprising two cup-shaped ends, the first cover portion 49A and the second cover portion 49B, having holes in the center through which the branch circuit wire 3A may pass. The lips of the portions 49A and 49B fit together over the sensor coil 6, so as to form a toroidal envelop protecting the sensor coil 6 and monitoring circuit 15. A transmission aperture 47 in the housing 46, facilitates transmission of radio frequency electromagnetic signals, ultrasonic signals, visible light signals, or infra-red light signals from the monitoring circuit 15, the signals bearing the current measurement information. The transmission aperture 47 may be aligned with an emitter in the monitoring circuit 15, to enable transmission of radio frequency electromagnetic signals, ultrasonic signals, visible light signals, or infra-red light signals from the emitter of the monitoring circuit 15. The example housing may also be integrally molded about the body of the sensor coil 6 and monitoring circuit, for example, by using a thermoplastic injection molding encapsulation process. The housing 46 provides a creepage distance to separate the sensor coil 6 from the branch circuit wire 3A and from other branch circuit wires, appropriate for typical branch circuit wire voltage levels. Creepage is the shortest path between two conductive parts (or between a conductive part and the bounding surface of the equipment) measured along the surface of the insulation. A proper and adequate creepage distance protects against tracking, a process that produces a partially conducting path of localized deterioration on the surface of an insulating material as a result of the electric discharges on or close to an insulation surface.

Figure 2:
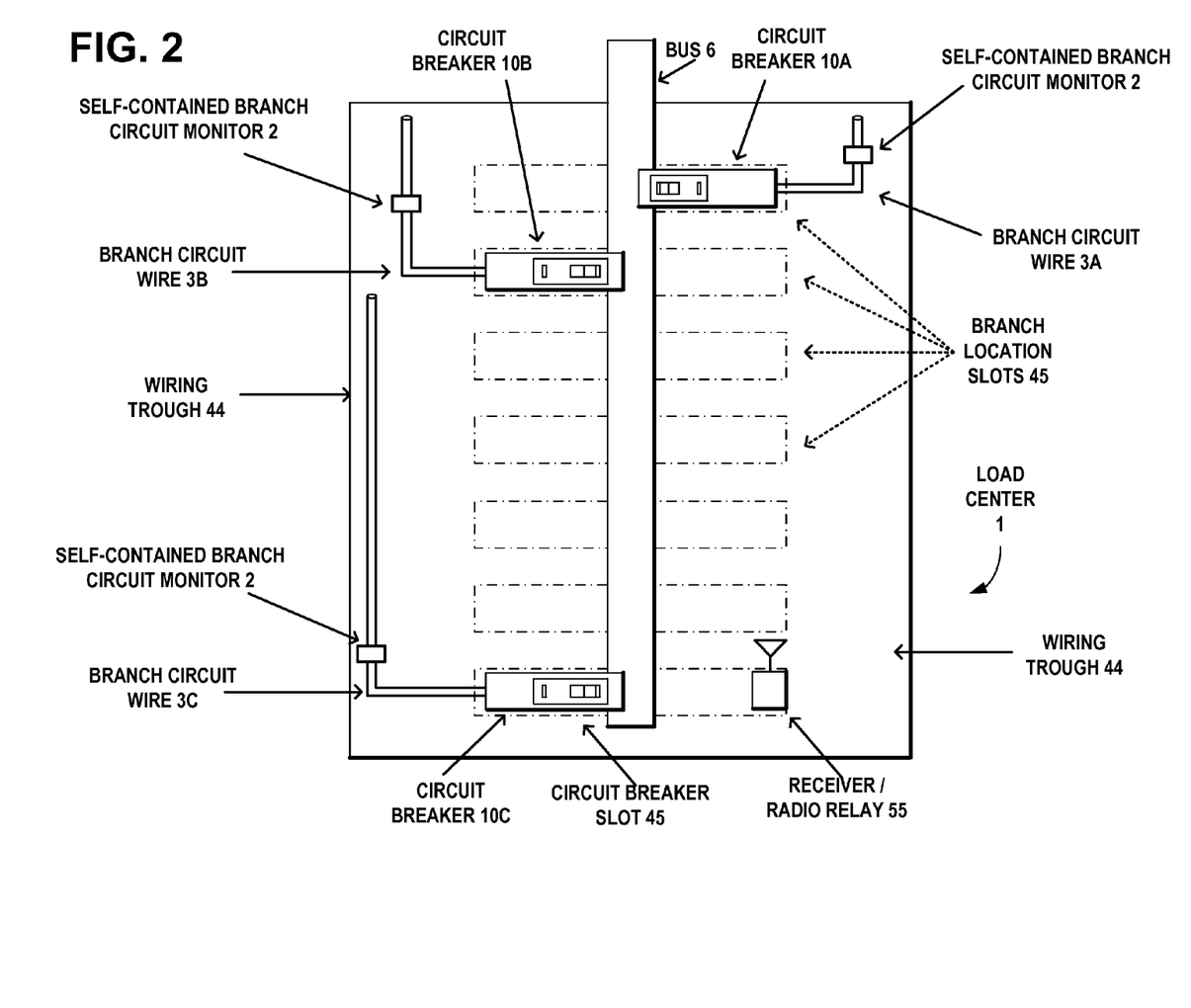
FIG. 2 illustrates an example embodiment of the invention, showing the self-contained branch circuit monitor as having a small form factor to enable fitting in a wiring trough of the load center or in the branch location slot of the load center. A plurality of branch circuit breakers are shown in the load center, with the load current in each circuit breaker being monitored by a corresponding self-contained branch circuit monitor located in the wiring trough of the load center.

FIG. 2 illustrates an example embodiment of the invention, showing the self-contained branch circuit monitor 2 as having a small form factor to enable fitting in a wiring trough 44 of the load center 1 or in the branch location slot 45 of the load center 1. The branch location slots 45 are shown as phantom lines in the figure. The branch circuit device, such as a branch circuit breaker 10A, is connected to the branch circuit wire 3A and the main power bus 6. The branch circuit breaker 10A is shown occupying a branch location slot 45 in the load center 1. The branch circuit wire 3A is shown threaded through the self-contained branch circuit monitor 2. The branch circuit devices may also include a ground fault isolator, a surge protector, an arc fault circuit breaker, or an automatic transfer switch, for example. A plurality of branch circuit breakers 10A, 10B, and 10C are shown occupying branch location slots 45 in the load center 1. A plurality of self-contained branch circuit monitors 2 are shown occupying the wiring trough 44 in the load center 1, each self-contained branch circuit monitor 2 being threaded on a respective branch circuit wire 3A, 3B, and 3C. The self-contained branch circuit monitors 2 may be easily retrofitted on the branch circuit wires in the load center 1.

In an alternate embodiment of the invention, the self-contained branch circuit monitor 2 may be retrofitted by attaching it to the body of the branch circuit breaker 10A by means of an adhesive. In another alternate embodiment of the invention, the self-contained branch circuit monitor 2 may be attached to the body of the branch circuit breaker 10A at the time of manufacture of the branch circuit breaker.

Figure 3:
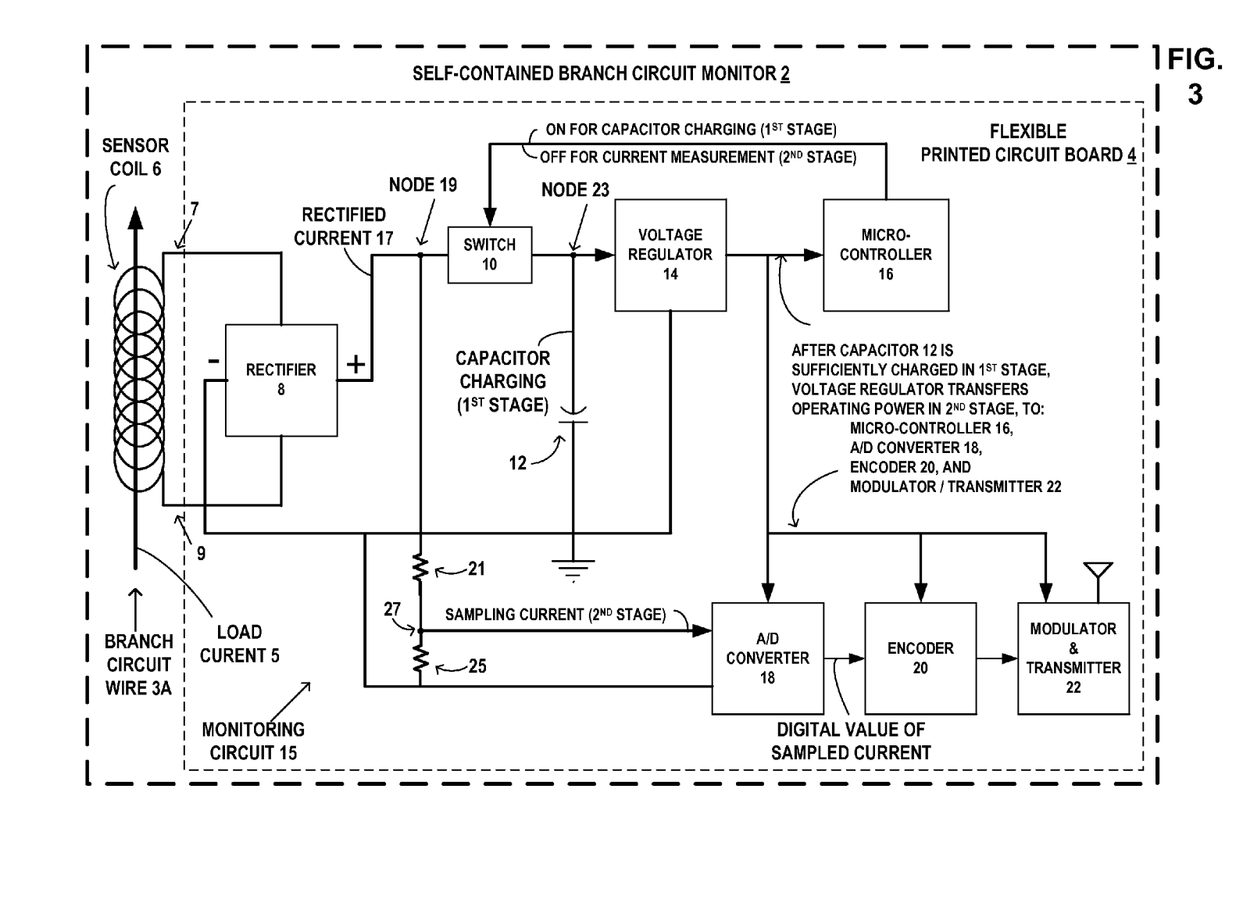
FIG. 3 illustrates an example embodiment of the invention, showing the flexible printed circuit board and an example monitoring circuit in the self-contained branch circuit monitor.

FIG. 3 illustrates an example embodiment of the invention, showing the flexible printed circuit board 4 and an example monitoring circuit 15 in the self-contained branch circuit monitor 2. The load current 5 is an alternating current flowing through the branch circuit wire 3A, which induces an alternating current in the sensor coil 6 by means of electromagnetic induction. The alternating magnetic field produced by the load current 5, inductively couples with the sensor coil 6, thereby producing the induced alternating current in the sensor coil 6. The induced alternating current in the sensor coil 6 is substantially proportional to the alternating load current 5 in the branch circuit wire 3A of the sensor coil 6. The leads 7 and 9 conduct the induced alternating current in the sensor coil 6 to the rectifier 8 in the monitoring circuit 15, on the flexible printed circuit board 4.

The rectifier 8 outputs the rectified current 17 to the node 19. Both the switch 10 and the voltage divider 21, 25 are connected to node 19.

During the first stage of operation, the switch 10 is conducting the rectified current 17 to the capacitor 12, charging the capacitor during the first stage. The self-contained branch circuit monitor 2 has a first mode of operation of managing the charging of the capacitor 12 with the rectified current 17 from the current induced in the sensor coil 6. The impedance represented by voltage divider 21, 25 limits the portion of the rectified current 17 diverted from charging the capacitor 12. In the first stage, the analog-to-digital (A/D) converter 18 is not powered and thus not operational.

As the capacitor 12 is charged during the first stage of operation, the voltage on node 23 increases. The voltage regulator 14 connected to the node 23, is configured to sense when the voltage on node 23 indicates that the capacitor 12 has been charged to a predetermined threshold value. When the voltage on node 23 reaches the predetermined threshold value, the voltage regulator 14 is configured to provide output power to the micro-controller 16, the analog-to-digital (A/D) converter 18, the encoder 20, and the modulator/transmitter 22. When the voltage on node 23 reaches the predetermined threshold value, this indicates a transition to the second stage of operation.

In the second stage of operation, the micro-controller 16, receives operating power from the voltage regulator 14, and sends a switching signal to the switch 10 to stop conducting the rectified current 17 to the node 23, thereby discontinuing the charging of the capacitor 12. The rectified current 17 flows through the voltage divider 21, 25 and an output voltage at node 27 proportional to the rectified current 17, is applied to the input of the analog-to-digital (A/D) converter, which is now receiving operating power from the voltage regulator 14. The analog-to-digital (A/D) converter 18 samples the output voltage at node 27 proportional to the rectified current 17, which is derived from the current induced in the sensor coil 6 during the second stage. The analog-to-digital (A/D) converter 18 is configured to output a digital value representing the magnitude of the load current 5 in the branch circuit wire 3A. This represents a second mode of operation of measuring the current induced in the sensor coil when voltage on the capacitor reaches a predefined value.

The encoder 20 and the modulator and transmitter 22 receive operating power from the voltage regulator 14. The encoder 20 receives the digital value from the analog-to-digital (A/D) converter 18, and encodes the digital value for transmission by the modulator and transmitter 22 during the second stage. The modulator and transmitter 22 transmits the digital value to a receiver 55 that may be located in the load center, as shown in FIG. 2, to provide information characterizing the load current 5 in the branch circuit wire 3A sensed in the branch circuit. The transmitter 22 may transmit the digital value to the receiver 55 by means of at least one of radio frequency electromagnetic signals, ultrasonic signals, visible light signals, and infra-red light signals. An example radio transmitter 22 may be a Bluetooth™ Low Energy (LE) transmitter that is capable of operating at low power levels. Transmission by the transmitter 22 represents a third mode of operation of transmitting a value of the measured current induced in the sensor coil. The receiver 55 may be a radio relay that forwards the current measurement value to a network, such as the Smart Grid. The information may be used to set an alarm, analyze energy consumption, stored for future use, or transmitted to the Smart Grid.

As the charge on the capacitor 12 dissipates during the second stage, the micro-controller 16 senses a reduction in the operational power provided by the analog-to-digital (A/D) converter 18. At a predefined operational power level, the micro-controller 16 sends a switch signal to the switch 10 to turn it on to conduct the rectified current 17 to recharge the capacitor 12. This returns the monitoring circuit 15 to the first stage, removing the operational power from the analog-to-digital (A/D) converter 18 the encoder 20, and the modulator/transmitter 22. The monitoring circuit 15 repeatedly cycles between the first stage of charging the capacitor 12 and the second stage of providing operational power to measure the branch circuit current 5 and transmit the information to a Smart Grid, for example.

As mentioned above, the self-contained branch circuit monitor has three modes of operation. The first mode of operation corresponds of the first stage of charging of the capacitor with the current induced in the sensor coil. The second mode of operation is measuring the current induced in the sensor coil when voltage on the capacitor reaches a predefined value. The third mode of operation is transmitting a value of the measured current induced in the sensor coil. The second mode of measuring the current must occur before the third mode of transmitting the measurement. In an example embodiment of the invention, the micro-controller 16 may control the timing of measurement in the second mode and transmission in the third mode. The action of transmission by the transmitter 22 requires energy, whether the transmission is with radio frequency electromagnetic signals, ultrasonic signals, visible light signals, or infra-red light signals. If the useable charge on the capacitor 12 has diminished below what is necessary for a transmission, the micro-controller may delay the occurrence of the third mode by storing the measured value of the current until the next cycle when the capacitor 12 has been recharged and the measured value can be transmitted. As another example, the micro-controller may evaluate the quality of the measurement, since it may be corrupted by noise, for example. In such a case, the micro-controller will discard the measurement and the third mode of transmission will not occur for that measurement.

In an example embodiment, the invention may perform a method to monitor current in a branch circuit in a load center to provide information to set an alarm, analyze energy consumption, store for future use, or transmit to a Smart Grid. An example method may comprise the following steps:

An example first step may be charging a capacitor in the self-contained branch circuit monitor during a first stage of operation, the charging being by a current induced in a sensor coil wound as a toroidal coil, the current being induced by a branch circuit current in a branch circuit wire threaded through the toroidal coil's center.

An example second step may be sensing when the capacitor has been charged to a threshold value indicating a transition to a second stage of operation wherein the capacitor supplies operating power to components formed on a flexible printed circuit board wrapped around the toroidal coil's outside circumference.

An example third step may be sampling the current induced in the sensor coil during the second stage of operation, the sampling being by the components formed on the flexible printed circuit board, the components using the operating power supplied by the charged capacitor, the sampled current induced in the sensor coil being a measure of the branch circuit current.

An example fourth step may be transmitting information representing the measure of the branch circuit current during the second stage of operation, the transmitting being by the components formed on the flexible printed circuit board, the components using the operating power supplied by the charged capacitor.

The information may be used to set an alarm, used to analyze energy consumption, stored for future use, or transmitted to a Smart Grid.

The above example method steps may represent computer code instructions stored in a memory of the micro-controller 16, in conjunction with the analog-to-digital (A/D) converter 18, the encoder 20, and the modulator/transmitter 22. The computer code instructions may be executed by a central processing unit (CPU) in the micro-controller 16, to carry out the functions of the example embodiments of the invention. The method steps may be carried out in another order than shown and individual steps may be combined or separated into component steps. Additional steps may be included in the method.

Although specific example embodiments of the invention have been disclosed, persons of skill in the art will appreciate that changes may be made to the details described for the specific example embodiments, without departing from the spirit and the scope of the invention.

What is claimed is:

1. A self-contained branch circuit monitor in a load center, comprising:
   a sensor coil of wire wound as a toroidal coil about a toroidal core, the toroidal core having a branch circuit wire in the load center threaded through the toroidal core's center;
   a flexible printed circuit board wrapped around the toroidal coil's outside circumference; and
   a monitoring circuit formed on the flexible printed circuit board, the monitoring circuit electrically connected to leads from the sensor coil, the monitoring circuit's operation being powered by current induced in the sensor coil from current in the branch circuit wire in the load center, the monitoring circuit being configured to use the operating power to sample the current induced in the sensor coil as a measure of the current in the branch circuit wire and to transmit signals representing a value of the measured current in the branch circuit wire to a radio relay receiver inside the load center, for forwarding to a network.

2. The self-contained branch circuit monitor in a load center of claim 1, further comprising:
   wherein the self-contained branch circuit monitor is enclosed in a housing that provides a creepage distance appropriate for branch circuit wire voltage.

3. The self-contained branch circuit monitor in a load center of claim 2, further comprising:
   a transmitter in the monitoring circuit, configured to transmit signals representing a value of the measured current in the branch circuit wire; and
   a transmission aperture in the housing, the transmission aperture being aligned with the transmitter and configured to facilitate transmission of the signals emitted by the transmitter.

4. The self-contained branch circuit monitor in a load center of claim 1, further comprising:
   wherein the flexible printed circuit board has conductive lines electrically interconnected with the monitoring circuit on the flexible printed circuit board, and an adhesive coating on a backside of the flexible printed circuit board to fasten the flexible printed circuit board to the toroidal coil's outside circumference.

5. The self-contained branch circuit monitor in a load center of claim 1, further comprising:
   wherein the self-contained branch circuit monitor has a small form factor to enable fitting within a limited space available in the load center, such as in a wiring trough or in a branch location slot.

6. A self-contained branch circuit monitor in a load center, comprising:
   a sensor coil of wire wound as a toroidal coil about a toroidal core, the toroidal core having a branch circuit wire threaded through the toroidal core's center;
   a flexible printed circuit board wrapped around the toroidal coil's outside circumference;
   a monitoring circuit formed on the flexible printed circuit board, the monitoring circuit electrically connected to leads from the sensor coil, the monitoring circuit's operation being powered by current induced in the sensor coil from current in the branch circuit wire, the monitoring circuit being configured to use the operating power to sample the current induced in the sensor coil as a measure of the current in the branch circuit wire;
   a rectifier coupled to the leads from the sensor coil;
   a capacitor coupled to the rectifier, the capacitor being charged by the current induced in the sensor coil during a first stage of operation; and
   a voltage regulator coupled to the capacitor, the voltage regulator configured to sense when the capacitor has been charged to a threshold value indicating a transition to a second stage of operation wherein the capacitor supplies operating power to components in the self-contained branch circuit monitor, the components being configured to use the operating power to sample the current induced in the sensor coil as a measure of the current in the branch circuit wire.

7. The self-contained branch circuit monitor in a load center of claim 6, further comprising:
   a current measuring device coupled to the voltage regulator to obtain operating power therefrom during the second stage, and coupled to the rectifier to sample the current induced in the sensor coil during the second stage, the current measuring device configured to output a value representing a magnitude of the current in the branch circuit wire.

8. The self-contained branch circuit monitor in a load center of claim 7, further comprising:
   a transmitter coupled to the voltage regulator to obtain operating power therefrom during the second stage, and coupled to the current measuring device, the transmitter configured to receive from the current measuring device, the value to transmit the digital value during the second stage.

9. The self-contained branch circuit monitor in a load center of claim 6, further comprising:
   wherein the self-contained branch circuit monitor has a first mode of operation of managing the charging of the capacitor with the current induced in the sensor coil;
   a second mode of operation of measuring the current induced in the sensor coil when voltage on the capacitor reaches a predefined value; and
   a third mode of operation of transmitting a value of the measured current induced in the sensor coil.

10. The self-contained branch circuit monitor in a load center of claim 8, further comprising:

wherein the transmitter transmits the value by means of at least one of radio frequency electromagnetic signals, ultrasonic signals, visible light signals, and infra-red light signals.

11. The self-contained branch circuit monitor in a load center of claim 6, further comprising:
an analog-to-digital (A/D) converter coupled to the voltage regulator to obtain operating power therefrom during the second stage, and coupled to the rectifier to sample the current induced in the sensor coil during the second stage, the analog-to-digital (A/D) converter configured to output a digital value representing a magnitude of the current in the branch circuit wire.

12. A load center, comprising:
a self-contained branch circuit monitor configured to fit in a wiring trough of the load center;
a sensor coil in the self-contained branch circuit monitor with a toroidal core, the toroidal core having a branch circuit wire in the load center threaded through the toroidal core's center;
a flexible printed circuit board in the self-contained branch circuit monitor, the flexible printed circuit board wrapped around the toroidal coil's outside circumference; and
a monitoring circuit formed on the flexible printed circuit board, the monitoring circuit electrically connected to leads from the sensor coil and powered by current induced in the sensor coil from current in the branch circuit wire in the load center of a branch circuit device in the load center and to transmit signals representing a value of the measured current in the branch circuit wire to a radio relay receiver inside the load center, for forwarding to a network.

13. The load center of claim 12, further comprising:
wherein the self-contained branch circuit monitor is enclosed in a housing that provides a creepage distance appropriate for branch circuit wire voltage.

14. The load center of claim 13, further comprising:
a transmitter in the monitoring circuit, configured to transmit signals representing a value of the measured current in the branch circuit wire; and
a transmission aperture in the housing, the transmission aperture being aligned with the transmitter and configured to facilitate transmission of the signals emitted by the transmitter.

15. The load center of claim 12, further comprising:
wherein the branch circuit device in the load center, is selected from the group consisting of a branch circuit breaker, a ground fault isolator, a surge protector, an arc fault circuit breaker, and an automatic transfer switch.

16. The load center of claim 12, further comprising:
wherein the self-contained branch circuit monitor has a small form factor to enable fitting within a limited space available in the load center, such as in a wiring trough or in a branch location slot.

17. The load center of claim 14, further comprising:
a receiver located in the load center, configured to receive the signals from the transmitter, the signals representing the value of the measured current in the branch circuit wire.

18. The load center of claim 17, further comprising:
wherein the value of the measured current in the branch circuit wire is used to set an alarm, analyze energy consumption, stored for future use, or transmitted to a Smart Grid.

19. A self-contained branch circuit monitor in a load center, comprising:
a sensor coil of wire wound as a toroidal coil about a toroidal core, the toroidal core having a branch circuit wire in the load center threaded through the toroidal core's center;
a flexible printed circuit board wrapped around the toroidal coil's outside circumference; and
a monitoring circuit formed on the flexible printed circuit board, the monitoring circuit electrically connected to leads from the sensor coil, the monitoring circuit's operation being powered by current induced in the sensor coil from current in the branch circuit wire in the load center, the monitoring circuit being configured to use the operating power to sample the current induced in the sensor coil as a measure of the current in the branch circuit wire and to transmit signals representing a value of the measured current in the branch circuit wire to a receiver inside the load center.

* * * * *